(12) United States Patent
Trehan et al.

(10) Patent No.: US 11,674,366 B2
(45) Date of Patent: Jun. 13, 2023

(54) METHOD AND SYSTEM OF PRODUCING HYDROCARBONS USING PHYSICS-BASED DATA-DRIVEN INFERRED PRODUCTION

(71) Applicant: ExxonMobil Technology and Engineering Company, Spring, TX (US)

(72) Inventors: Sumeet Trehan, The Woodlands, TX (US); Damian N. Burch, The Woodlands, TX (US); Amr S. El-Bakry, Houston, TX (US); Peeyush Bhargava, The Woodlands, TX (US); Curtis J. Holub, Spring, TX (US); Jose F. Zapata Usandivaras, Capital Federal (AR)

(73) Assignee: ExxonMobil Technology and Engineering Company, Spring, TX (US)

(*) Notice: Subject to any disclaimer, the term of this patent is extended or adjusted under 35 U.S.C. 154(b) by 500 days.

(21) Appl. No.: 16/436,402

(22) Filed: Jun. 10, 2019

(65) Prior Publication Data
US 2019/0390534 A1 Dec. 26, 2019

Related U.S. Application Data

(60) Provisional application No. 62/689,454, filed on Jun. 25, 2018.

(51) Int. Cl.
*E21B 41/00* (2006.01)
*E21B 43/12* (2006.01)
*E21B 49/08* (2006.01)
*E21B 47/008* (2012.01)

(52) U.S. Cl.
CPC ........ *E21B 41/0092* (2013.01); *E21B 43/128* (2013.01); *E21B 47/008* (2020.05); *E21B 49/08* (2013.01); *E21B 49/0875* (2020.05)

(58) Field of Classification Search
None
See application file for complete search history.

(56) References Cited

U.S. PATENT DOCUMENTS

| | | | |
|---|---|---|---|
| 2005/0173114 A1* | 8/2005 | Cudmore | E21B 47/008 166/250.15 |
| 2009/0044938 A1* | 2/2009 | Crossley | G05B 17/02 166/250.15 |

(Continued)

*Primary Examiner* — Lina M Cordero
(74) *Attorney, Agent, or Firm* — ExxonMobil Technology and Engineering Company—Law Department (57) ABSTRACT

A method of predicting hydrocarbon production from one or more artificial lift wells is disclosed. Measurements and/or well test data are obtained from one or more artificial lift wells representing well performance at more than one time period. A statistical model, representing well performance, is generated. Using the statistical model and the measurements and/or well test data, real-time production of the one or more artificial lift wells is predicted and a measure of confidence is generated. Potential optimization opportunities are identified for well performance based on the predicted real-time production of the one or more artificial lift wells. The optimization opportunities are outputted. Hydrocarbon production activities are modified using the optimization opportunities.

18 Claims, 4 Drawing Sheets

(56) References Cited

U.S. PATENT DOCUMENTS

| | | | |
|---|---|---|---|
| 2009/0198478 A1* | 8/2009 | Cuevas | E21B 43/122 703/10 |
| 2014/0297235 A1* | 10/2014 | Arora | E21B 43/00 703/2 |
| 2016/0153266 A1* | 6/2016 | Rashid | G05D 7/0635 700/282 |
| 2016/0265321 A1* | 9/2016 | Elmer | F04B 47/022 |
| 2017/0030359 A1* | 2/2017 | Fowler | F04D 15/0066 |
| 2017/0356279 A1* | 12/2017 | Nandola | E21B 47/04 |
| 2018/0181693 A1* | 6/2018 | Yang | G06F 30/20 |
| 2019/0112914 A1* | 4/2019 | Chen | E21B 49/08 |

\* cited by examiner

METHOD AND SYSTEM OF PRODUCING HYDROCARBONS USING PHYSICS-BASED DATA-DRIVEN INFERRED PRODUCTION

CROSS-REFERENCE TO RELATED APPLICATION

This application claims the priority benefit of U.S. Provisional Patent Application No. 62/689,454 filed Jun. 25, 2018 entitled METHOD AND SYSTEM OF PRODUCING HYDROCARBONS USING PHYSICS-BASED DATA-DRIVEN INFERRED PRODUCTION, the entirety of which is incorporated by reference herein.

FIELDS OF DISCLOSURE

The disclosure relates generally to hydrocarbon production. More specifically, the disclosure relates to determining production rates of hydrocarbon wells.

DESCRIPTION OF RELATED ART

This section is intended to introduce various aspects of the art, which may be associated with the present disclosure. This discussion is intended to provide a framework to facilitate a better understanding of particular aspects of the present disclosure. Accordingly, it should be understood that this section should be read in this light, and not necessarily as admissions of prior art.

Figure 1:
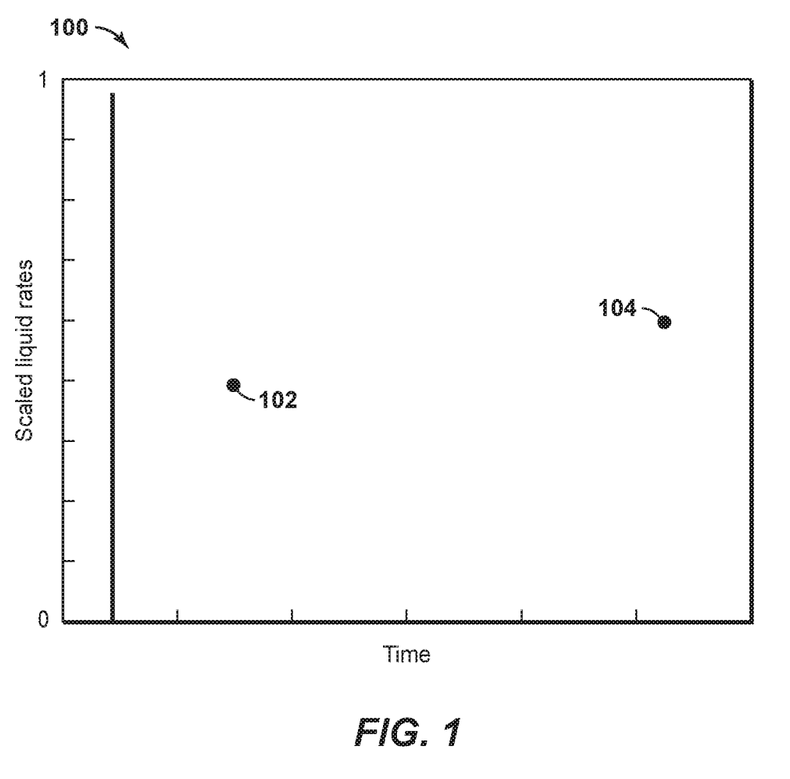
FIG. 1 is a graph showing scaled production rates of a well at two different times.

Artificial lift technology is being increasingly applied to provide uplift in production wells in both conventional and unconventional assets. To measure production/uplift from a well (using artificial lift technology), well tests are periodically performed. These well tests, which are expensive to perform, provide production information only during the duration of the well test. The duration of a typical well test is a few hours, and for a given well, well tests are performed a few times per year. As a result, between two successive well test (which may be separated by days or weeks or months), there is no information about the production. This can be observed from FIG. 1, which is a graph 100 showing scaled production rates of an artificial lift well. The graph 100 shows that the results of a first well test 102 and a second well test 104, four weeks apart, give no information about the production rate of the well for the intervening time. Knowing current production rates can be useful in planning for hydrocarbon production activities, but constantly performing well tests can be burdensome even in production fields with just a few producing/injecting wells. What is needed is an economical method of determining or inferring production rates of hydrocarbon wells.

SUMMARY

The present disclosure provides a method of predicting hydrocarbon production from one or more artificial lift wells. Measurements and/or well test data are obtained from the one or more artificial lift wells representing well performance at more than one time period. A statistical model representing well performance is generated. The statistical model and the measurements and/or well test data are used to predict real-time production of the one or more artificial lift wells, and a confidence interval is generated. Potential optimization opportunities for well performance are identified based on the predicted real-time production of the one or more artificial lift wells. The optimization opportunities are outputted to a user. Hydrocarbon production activities are modified using the optimization opportunities.

The disclosure also provides a method of predicting hydrocarbon production from one or more artificial lift wells. Measurements and/or well test data from the one or more artificial lift wells are obtained representing well performance at more than one time period. A statistical model representing well performance is generated. Using the statistical model and the measurements and/or well test data, real-time production of the one or more artificial lift wells is predicted and a measure of confidence is generated. If the measure of confidence is greater than a pre-determined level, additional measurements and/or test data are obtained from the one or more artificial lift wells representing well performance at an additional time period. If the measure of confidence is less than the pre-determined level, potential optimization opportunities for well performance are identified based on the predicted real-time production of the one or more artificial lift wells. The optimization opportunities are outputted. Hydrocarbon production activities are modified using the optimization opportunities.

The disclosure also provides an apparatus for predicting production data from one or more artificial lift wells. The apparatus includes a processor and an input device in communication with the processor, the input device configured to receive input data comprising measurements and/or test data from the one or more artificial lift wells representing well performance at more than one time period. A memory is in communication with the processor. The memory has a set of instructions, which when executed by the processor, are configured to: generate a statistical model representing well performance; using the statistical model and the measurements and/or well test data, predict real-time production of the one or more artificial lift wells and generate a measure of confidence; if the measure of confidence is greater than a pre-determined level, obtain additional measurements and/or test data from the one or more artificial lift wells representing well performance at an additional time period; if the measure of confidence is less than the pre-determined level, identify potential optimization opportunities for well performance based on the predicted real-time production of the one or more artificial lift wells; and output the optimization opportunities so that hydrocarbon production activities may be modified using said optimization opportunities.

The disclosure further provides a method of producing hydrocarbons from one or more artificial lift wells. Measurements and/or well test data are obtained from the one or more artificial lift wells representing well performance at more than one time period. A statistical model of the one or more artificial lift wells is generated. The statistical model represents well performance of the one or more artificial lift wells. Using the statistical model and the measurements and/or well test data, real-time production of the one or more artificial lift wells is predicted and a confidence interval is generated. If the confidence interval is greater than a pre-determined level, additional measurements and/or test data are obtained from the one or more artificial lift wells representing well performance at an additional time period. If the confidence interval is less than the pre-determined level, potential optimization opportunities for well performance are identified based on the predicted real-time production of the one or more artificial lift wells. The optimization opportunities are outputted. Hydrocarbons from the one or more artificial lift wells are produced using the optimization opportunities.

The foregoing has broadly outlined the features of the present disclosure in order that the detailed description that follows may be better understood. Additional features will also be described herein.

BRIEF DESCRIPTION OF THE DRAWINGS

These and other features, aspects and advantages of the disclosure will become apparent from the following description, appending claims and the accompanying drawings, which are briefly described below.

It should be noted that the figures are merely examples and no limitations on the scope of the present disclosure are intended thereby. Further, the figures are generally not drawn to scale, but are drafted for purposes of convenience and clarity in illustrating various aspects of the disclosure.

DETAILED DESCRIPTION

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

Aspects of the disclosure predict real-time production for one or more interconnected or commingled wells using artificial lift technology. The prediction is based on individual well characteristics. Further, disclosed aspects focus on artificial lift technologies, such as electric submersible pumps (ESPs), progressing cavity pumps (PCPs), rod pumps, or other similar technologies. Aspects of the disclosure are based on combining pump and flow physics with historical pump and well test data. Such well-by-well real-time predictions are useful in the context for well and/or field surveillance and optimization. The disclosed aspects may also apply to one or more interconnected or commingled wells that use multistage pumps.

The following provides a detailed description of the approach developed according to disclosed aspects. The example described below uses ESPs as the artificial lift technology. However, an analogous approach is applicable when PCPs, rod pumps, or other artificial lift technologies are used.

The modeling approach developed as part of the current disclosure will first be described.

To preserve geometric and dynamic similarity for a pump, it can be written:

$$G(gH,N,P,\rho,\mu,Q,D,k)=0 \quad \text{(Eq. 1)},$$

where H denotes the head, N is the speed ($T^{-1}$) P is the electrical and/or mechanical power of the pump, g is the gravitational force, $\rho$ is fluid density, $\mu$ is the fluid viscosity, Q is the flow rate through the pump, D is the impeller diameter of the pump, and k is the mean height of roughness in the machine.

Next, using Buckingham's second $\pi$ theorem (which is a formalization of Rayleigh's method of dimensional analysis), it can be written:

$$G(\pi_1, \pi_2, \pi_3, \pi_4, \pi_5) = 0 \quad \text{(Eq. 2)},$$

where $\pi_1 = \dfrac{gH}{N^2 D^2} = \dfrac{\Delta p}{\rho N^2 D^2}$, $\pi_2 = \dfrac{P}{D^5 N^3 \rho}$, $\pi_3 = \dfrac{\mu}{D^2 N \rho}$, $\pi_4 = \dfrac{Q}{D^3 N}$, and $\pi_5 = \dfrac{k}{D}$.

Therefore, $\pi_4$, the only $\pi$ group containing Q, can be modeled as $$\pi_4 = J(\pi_1, \pi_2, \pi_3) \quad \text{(Eq. 3)}.$$

Here, $\pi_5$ is neglected as constant for a given well. Note that in $\pi_1$, $\Delta p = p_{in} - p_{discharge}$, where $p_{in}$ denotes the pump inlet pressure and $p_{discharge}$ is the pump discharge pressure, which is usually unavailable. Further, $$p_{discharge} = p_{wh} + p_{friction} + \rho g L \quad \text{(Eq. 4)},$$

where $p_{wh}$ denotes well head pressure. Assuming friction loss to be negligible relative to $\rho g L$ which is a constant in itself, then $\Delta p \approx p_{in} - p_{wh} - \rho g L$. Further, $\rho g L$ (a constant) is absorbed within the statistical model, and therefore for simplicity, $$\Delta p \approx p_{in} - p_{wh} \quad \text{(Eq. 5)}.$$

For a fluid flow through a well employing an ESP or a PCP, $$Q p_{in}(p_{wh} + \rho g L + p_{friction}) = V \times I \times PF \times \eta_p \quad \text{(Eq.6)},$$

where V denotes voltage, I denotes current, PF is the power factor, and $\eta_p$ is the pump efficiency. This follows from fundamental fluid mechanics. Here, PF(t), where t denotes time, is the ratio of the real electrical and/or mechanical power that is used to do work and the apparent electrical and/or mechanical power that is supplied to the circuit. Since power factor information may be unavailable, it can be assumed that $$Q(p_{in} - (p_{wh} + \rho g L + p_{friction})) = \eta P \quad \text{(Eq. 7)},$$

where η is estimated by deterministic inverse modeling, using available well test data:

$$\min_{\eta} \|Q_{observed} - Q_{predicted}\|_2^2. \quad \text{(Eq. 8)}$$

Here, $Q_{predicted}$ is computed by solving the non-linear Equation 7. It is assumed that efficiency remains constant in the short term.

A first machine learning-based formulation may be obtained as follows. First, power P in $\pi_e$ may be redefined as $p_\eta$. Then, given training dataset $$T_{training} = \{(d)_{wt=1}, (\pi_4)_{wt=1}, (d)_{wt=2}, (\pi_4)_{wt=2}, \ldots, (d)_{wt=n}, (\pi_4)_{wt=n}\},$$

$$(d)_i = [(\pi_1)_i, (\pi_2)_i, (\pi_3)_i] \in \mathbb{R}^3, (\pi_4)_i \in \mathbb{R} \quad \text{(Eq. 9)},$$

find the form of the mapping $$(\pi h_4)_i = J((d)_i) + \epsilon \quad \text{(Eq. 10)}$$

where ϵ denotes measurement noise. For test data $(d)_*$, the inferred rate is $$(\pi_4)_* = J((d)_*) \quad \text{(Eq. 11)}.$$

It should be noted that $(\pi_4)_*$ is predicted using $J((d)_*)$, and then $Q = (\pi_4)_* \times D^3 \times N$ may be computed, as D and N are known. Model hyperparameters may be computed using cross-validation.

A second machine learning-based formulation may be obtained as follows. Given the training dataset $$T_{training} = \{(d)_{wt=1}, (\pi_4)_{wt=1}, (d)_{wt=2}, (\pi_4)_{wt=2}, \ldots, (d)_{wt=n}, (\pi_4)_{wt=n}\},$$

$$(d)_i = [(\pi_1)_i, (\pi_2)_i, (\pi_3)_i, \eta_i] \in \mathbb{R}^4, (\pi_4)_i \in \mathbb{R} \quad \text{(Eq. 12)}$$

find the form of the mapping $$(\pi_4)_i = J((d)_i) + \epsilon \quad \text{(Eq. 13)},$$

where ϵ denotes measurement noise. For test data $(d)_*$, the inferred rate is $$(\pi_4)_* = J((d)_*) \quad \text{(Eq. 14)}.$$

It should be noted that $(\pi_4)_*$ is predicted using $J((d)_*)$, and then $Q = (\pi_4)_* \times D^3 \times N$ may be computed, as D and N are known. Model hyperparameters may be computed using cross-validation.

It should be noted that the pi grouping defined in Equation (2), and the list and configuration of the parameters used to define each pi element in the grouping, are not unique. The definition of each pi element may be varied to more closely model pump performance. Alternatively, the definitions may be varied to increase ease of computability. Similar pi groupings may be used to model a pump. Furthermore, the pi groupings, and the list and configuration of respective parameters, may be varied according to the type of pump being modeled.

Figure 2:
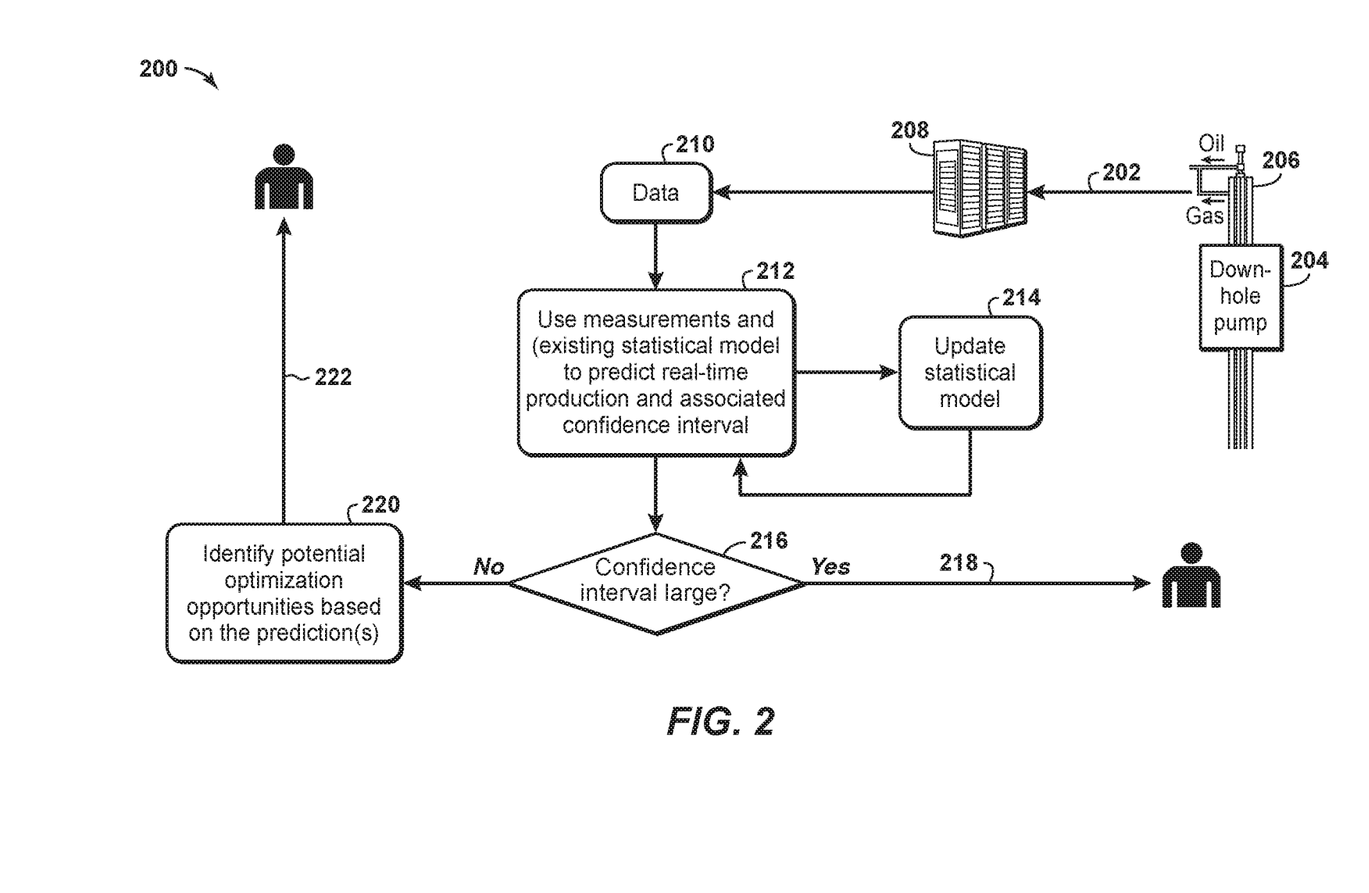
FIG. 2 is a flowchart showing a method of inferring production rates according to an aspect of the disclosure.
Figure 3:
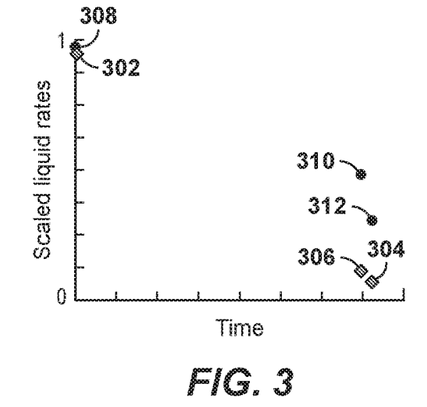
FIG. 3 is a graph comparing actual production rates with inferred production rates according to aspects of the disclosure.
Figure 4:
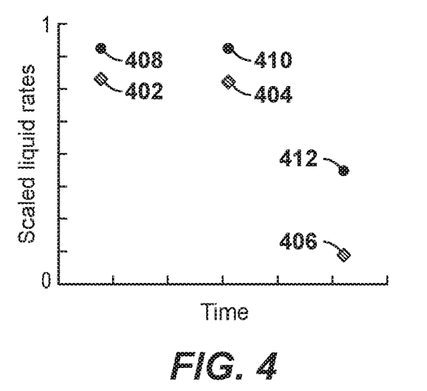
FIG. 4 is a graph comparing actual production rates with inferred production rates according to aspects of the disclosure.
Figure 5:
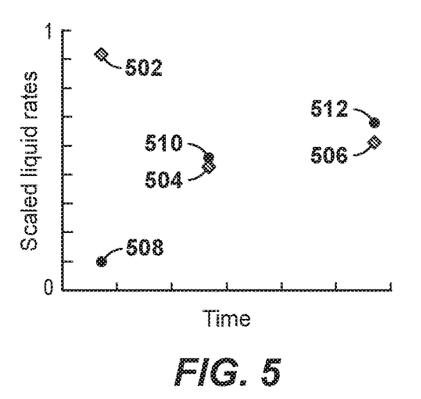
FIG. 5 is a graph comparing actual production rates with inferred production rates according to aspects of the disclosure.
Figure 6:
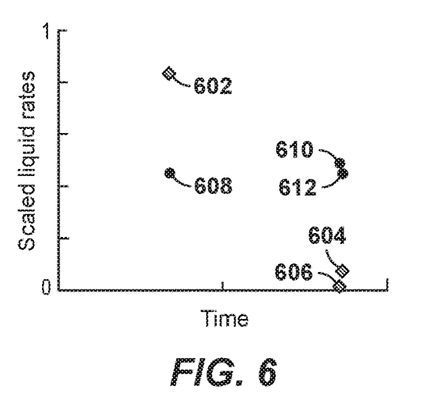
FIG. 6 is a graph comparing actual production rates with inferred production rates according to aspects of the disclosure.

FIG. 2 is a schematic depicting steps of a workflow 200 according to disclosed aspects. Measurements and/or well test data 202 from a downhole pump 204 in one or more wells (represented in FIG. 2 by well 206) are stored in a server 208 or other memory device. The pump may be an electric submersible pump, a progressing cavity pump, a rod pump, or the like. In an aspect, the measurements and/or well test data include one or more of pump head, pump speed, electrical and/or mechanical pump power, fluid density, fluid viscosity, fluid flow rate through the pump, pump impeller diameter, and the mean height of roughness in a pump associated with one or more of the artificial lift wells. In another aspect, pump discharge pressure information and/or pump inlet pressure information are not collected or used herein. The measurements and/or well test data 202 are combined with real-time data 210 and at 212 are used, along with an existing statistical model relating to pump performance, to predict real-time production and an associated measure of confidence. In an aspect, the statistical model includes reservoir rock and/or fluid properties. The prediction of real-time production may comprise machine learning-based formulations. If a new well test is performed, at 214 the statistical model is updated. At 216 the measure of confidence is analyzed, and if the measure of confidence is not sufficiently high (for example, if the standard deviation is large), at 218 a new well test is performed. If the measure of confidence is sufficiently high (for example, standard deviation is small), at 220 potential optimization opportunities are identified based on the production predictions. At 222 the potential optimization opportunities are communicated to a user or to the control system of the well or wells so that well performance is optimized. Such potential opportunities for well performance optimization may include: modifying the function of the ESP, PCP, or rod pump in the well, or in each well in a group of wells; initiating/maintaining/modifying a well stimulation strategy, a well intervention strategy, and/or a well work-over strategy; choke optimization; well scheduling; well shut-in schedules; pump issue identification; surveillance of one or more wells; and field surveillance.

It is important to note that the steps depicted in FIG. 2 are provided for illustrative purposes only and a particular step may not be required to perform the inventive methodology. The claims, and only the claims, define the inventive system and methodology.

The results of the disclosed aspects may be seen in the scaled production graphs of FIGS. 3-6, compare actual production rates 302, 304, 306 (FIG. 3), 402, 404, 406 (FIG. 4), 502, 504, 506 (FIG. 5), and 602, 604, 606 (FIG. 6) for four different wells, with inferred production rates 308, 310, 312 (FIG. 3), 408, 410, 412 (FIG. 4), 508, 510, 512 (FIG. 5), and 608, 610, 612 (FIG. 6) calculated according to aspects of the disclosure.

The disclosed aspects have been described as being advantageously used to estimate and optimize real-time production; however, the disclosed aspects may also be used in historical analysis to estimate production on a well-by-well basis or a commingled well-basis.

Figure 7:
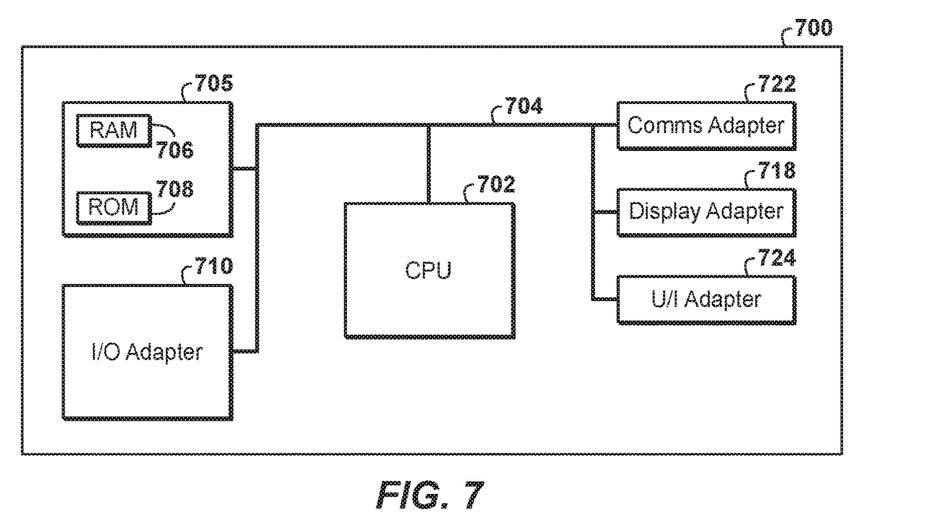
FIG. 7 is a schematic diagram of a computer system according to aspects of the disclosure.

FIG. 7 is a block diagram of a general purpose computer system 700 suitable for implementing one or more embodiments of the components described herein. The computer system 700 comprises a central processing unit (CPU) 702 coupled to a system bus 704. The CPU 702 may be any general-purpose CPU or other types of architectures of CPU 702 (or other components of exemplary system 700), as long as CPU 702 (and other components of system 700) supports the operations as described herein. Those of ordinary skill in the art will appreciate that, while only a single CPU 702 is shown in FIG. 7, additional CPUs may be present. Moreover, the computer system 700 may comprise a networked, multi-processor computer system that may include a hybrid parallel CPU/Graphics Processing Unit (GPU) system (not depicted). Alternatively, part or all of the computer system 700 may be included either in the firmware stored on sensors positioned to gather relevant pump and/or well data, or in devices close to the well. The CPU 702 may execute the various logical instructions according to various embodiments. For example, the CPU 702 may execute machine-level instructions for performing processing according to the operational flow described above in conjunction with FIG. 2.

The computer system 700 may also include computer components such as non-transitory, computer-readable media or memory 705. The memory 705 may include a RAM 706, which may be SRAM, DRAM, SDRAM, or the like. The memory 705 may also include additional non-transitory, computer-readable media such as a Read-Only-Memory (ROM) 708, which may be PROM, EPROM, EEPROM, or the like. RAM 706 and ROM 708 may hold user data, system data, data store(s), process(es), and/or software, as known in the art. The memory 705 may suitably store measurements and/or test data from one or more artificial lift wells for one or more time periods as described in connection with FIG. 2. The computer system 700 may also include an input/output (I/O) adapter 710, a communications adapter 722, a user interface adapter 724, and a display adapter 718.

The I/O adapter 710 may connect one or more additional non-transitory, computer-readable media such as an internal or external storage device(s) (not depicted), including, for example, a hard drive, a compact disc (CD) drive, a digital video disk (DVD) drive, a floppy disk drive, a tape drive, and the like to computer system 700. The storage device(s) may be used when the memory 705 is insufficient or otherwise unsuitable for the memory requirements associated with storing measurements and/or test data for operations of embodiments of the present techniques. The data storage of the computer system 700 may be used for storing information and/or other data used or generated as disclosed herein. For example, storage device(s) may be used to store the statistical model, predictions of real-time production, associated measures of confidence, identified potential optimization opportunities, and instruction sets to automate part or all of the method disclosed in FIG. 2. Further, user interface adapter 724 may couple to one or more user input devices (not depicted), such as a keyboard, a pointing device and/or output devices, etc. to the computer system 700. The CPU 702 may drive the display adapter 718 to control the display on a display device (not depicted), e.g., a computer monitor or handheld display, to, for example, present potential optimization opportunities to a user.

The computer system 700 further includes communications adapter 722. The communications adapter 722 may comprise one or more separate components suitably configured for computer communications, e.g., one or more transmitters, receivers, transceivers, or other devices for sending and/or receiving signals. The computer communications adapter 722 may be configured with suitable hardware and/or logic to send data, receive data, or otherwise communicate over a wired interface or a wireless interface, e.g., carry out conventional wired and/or wireless computer communication, radio communications, near field communications (NFC), optical communications, scan an RFID device, or otherwise transmit and/or receive data using any currently existing or later-developed technology.

The architecture of system 700 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. Additional alternative computer architectures may be suitably employed, e.g., cloud computing, or utilizing one or more operably connected external components to supplement and/or replace an integrated component. Additional data gathering systems and/or computing devices may also be used. In fact, persons of ordinary skill in the art may use any number of suitable structures capable of executing logical operations according to the embodiments. In an embodiment, input data to the computer system 700 may include various plug-ins and library files. Input data may additionally include configuration information.

Figure 8:
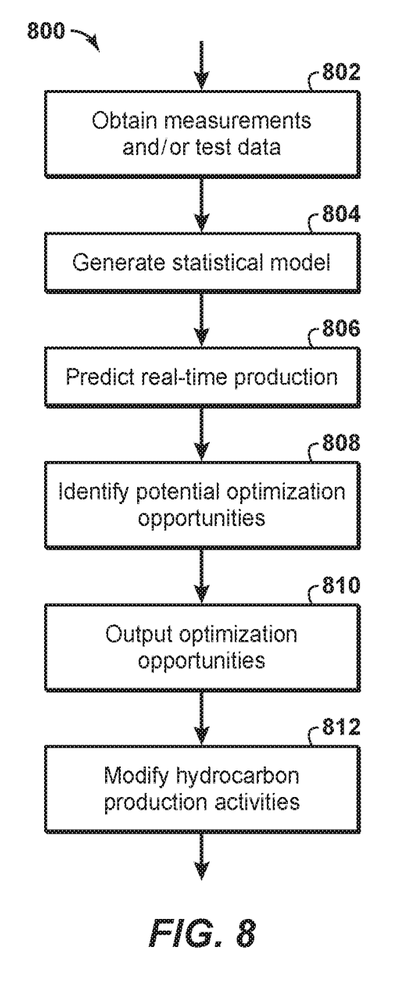
FIG. 8 is a flowchart of a method according to disclosed aspects.

FIG. 8 is a flowchart depicting a method 800 of predicting hydrocarbon production from one or more artificial lift wells, according to disclosed aspects. At block 802 measurements and/or well test data are obtained from the one or more artificial lift wells representing well performance at more than one time period. At block 804 a statistical model is generated representing well performance. At block 806 real-time production of the one or more artificial lift wells is predicted using the statistical model and the measurements and/or well test data, and a measure of confidence of the prediction is generated. At block 808 potential optimization opportunities for well performance are identified based on the predicted real-time production of the one or more artificial lift wells. At block 810 the optimization opportunities are outputted. At block 812 hydrocarbon production activities are modified using the optimization opportunities.

Figure 9:
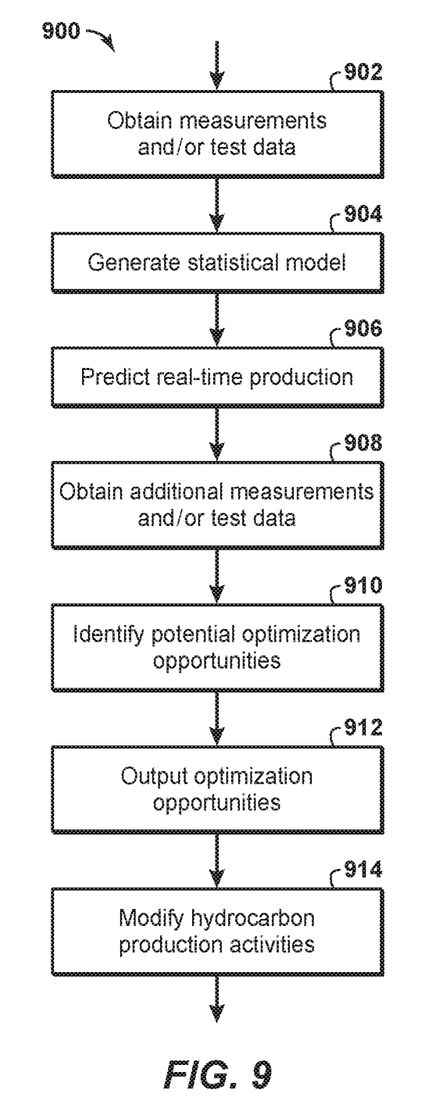
FIG. 9 is a flowchart of a method according to disclosed aspects.

FIG. 9 is a flowchart depicting a method 900 of predicting hydrocarbon production from one or more artificial lift wells according to disclosed aspects. At block 902 measurements and/or well test data are obtained from the one or more artificial lift wells representing well performance at more than one time period. At block 904 a statistical model representing well performance is generated. At block 906 real-time production of the one or more artificial lift wells is predicted using the statistical model and the measurements and/or well test data, and a measure of confidence of the prediction is generated. At block 908 additional measurements and/or test data are obtained from the one or more artificial lift wells representing well performance at an additional time period if the measure of confidence is greater than a pre-determined level. At block 910 potential optimization opportunities for well performance are identified based on the predicted real-time production of the one or more artificial lift wells if the measure of confidence is less than the pre-determined level. At block 912 the optimization opportunities are outputted. At block 914 hydrocarbon production activities are modified using the optimization opportunities. For example, hydrocarbons may be produced from the one or more artificial lift wells using the optimization opportunities.

Disclosed aspects may be used in hydrocarbon management activities. As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. The term "hydrocarbon management" is also used for the injection or storage of hydrocarbons or $CO_2$, for example the sequestration of $CO_2$, such as reservoir evaluation, development planning, and reservoir management. The disclosed methodologies and techniques may be used to produce hydrocarbons in a feed stream extracted from, for example, a subsurface region. Hydrocarbon extraction may be conducted to remove the feed stream from for example, the subsurface region, which may be accomplished by drilling a well using oil well drilling equipment. The equipment and techniques used to drill a well and/or extract the hydrocarbons are well known by those skilled in the relevant art Other hydrocarbon extraction activities and, more generally, other hydrocarbon management activities, may be performed according to known principles.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numeral ranges provided. Accordingly, these terms should be interpreted as indicating that insubstantial or inconsequential modifications or alterations of the subject matter described are considered to be within the scope of the disclosure.

The articles "the", "a" and "an" are not necessarily limited to mean only one, but rather are inclusive and open ended so as to include, optionally, multiple such elements.

It should be understood that numerous changes, modifications, and alternatives to the preceding disclosure can be made without departing from the scope of the disclosure. The preceding description, therefore, is not meant to limit the scope of the disclosure. Rather, the scope of the disclosure is to be determined only by the appended claims and their equivalents. It is also contemplated that structures and features in the present examples can be altered, rearranged, substituted, deleted, duplicated, combined, or added to each other.

What is claimed is:

1. A method of predicting hydrocarbon production from one or more artificial lift wells, comprising:
   obtaining measurements and/or well test data from the one or more artificial lift wells representing well performance at more than one time period, the measurements and/or well test data representing a fluid flow rate through a pump associated with the one or more artificial lift wells, wherein the fluid flow rate through the pump is determined using formula:

$$G(gH,N,P,\rho,\mu,Q,D,k)=0 \qquad \text{(Eq. 1)},$$

where H denotes a pump head, N is a pump speed ($T^{-1}$), P is an electrical and/or mechanical power of the pump, g is a gravitational force, $\rho$ is a fluid density, $\mu$ is a fluid viscosity, Q is the fluid flow rate through the pump, D is an impeller diameter of the pump, and k is a mean height of roughness in the pump;
   obtaining a statistical model representing the well performance;
   using the statistical model and the measurements and/or well test data, predicting real-time production of the one or more artificial lift wells and generating a measure of confidence;
   identifying potential optimization opportunities for the well performance based on the predicted real-time production of the one or more artificial lift wells;
   outputting the potential optimization opportunities; and
   modifying hydrocarbon production activities using the potential optimization opportunities.

2. The method of claim 1, further comprising:
   generating the measure of confidence using the statistical model and the measurements and/or well test data; and
   when the measure of confidence is greater than a pre-determined level, obtaining additional measurements and/or test data from the one or more artificial lift wells representing the well performance at an additional time period;
   wherein the potential optimization opportunities are identified when the measure of confidence is less than the pre-determined level.

3. The method of claim 1, wherein modifying the hydrocarbon production activities comprises modifying performance of one of the one or more artificial lift wells.

4. The method of claim 1, wherein modifying the hydrocarbon production activities comprises one or more of modifying performance of the pump, well stimulation activities, well intervention activities, and well work-over activities.

5. The method of claim 4, wherein the pump comprises an electric submersible pump or a progressing cavity pump.

6. The method of claim 1, wherein predicting the real-time production comprises a machine learning-based formulation.

7. The method of claim 1, further comprising:
   storing the measurements and/or well test data from the more than one time period until the real-time production is predicted.

8. The method of claim 1, wherein the measurements and/or well test data include one or more of the pump head, the pump speed, the electrical and/or mechanical power of the pump, the fluid density, the fluid viscosity, the impeller diameter of the pump, and the mean height of roughness in the pump associated with the one or more artificial lift wells.

9. A method of predicting hydrocarbon production from one or more artificial lift wells, comprising:
   obtaining measurements and/or well test data from the one or more artificial lift wells representing well performance at more than one time period, the measurements and/or well test data representing a fluid flow rate through a pump associated with the one or more artificial lift wells, wherein the fluid flow rate through the pump is determined using formula:

$$G(gH,N,P,\rho,\mu,Q,D,k)=0 \qquad \text{(Eq. 1)},$$

where H denotes a pump head, N is a pump speed ($T^{-1}$), P is an electrical and/or mechanical power of the pump, g is a gravitational force, $\rho$ is a fluid density, $\mu$ is a fluid viscosity, Q is the fluid flow rate through the pump, D is an impeller diameter of the pump, and k is a mean height of roughness in the pump;
   obtaining a statistical model representing the well performance;
   using the statistical model and the measurements and/or well test data, predicting real-time production of the one or more artificial lift wells and generating a measure of confidence;
   when the measure of confidence is greater than a pre-determined level, obtaining additional measurements and/or test data from the one or more artificial lift wells representing the well performance at an additional time period;
   when the measure of confidence is less than the pre-determined level, identifying potential optimization opportunities for the well performance based on the predicted real-time production of the one or more artificial lift wells;
   outputting the potential optimization opportunities; and
   modifying hydrocarbon production activities using the potential optimization opportunities.

10. An apparatus for predicting production data from one or more artificial lift wells, comprising:
a processor;
an input device in communication with the processor and configured to receive input data comprising measurements and/or test data from the one or more artificial lift wells representing well performance at more than one time period, the measurements and/or well test data representing a fluid flow rate through a pump associated with the one or more artificial lift wells, wherein the fluid flow rate through the pump is determined using formula:

$$G(gH,N,P,\rho,\mu,Q,D,k)=0 \qquad \text{(Eq. 1),}$$

where H denotes a pump head, N is a pump speed ($T^{-1}$), P is an electrical and/or mechanical power of the pump, g is a gravitational force, $\rho$ is a fluid density, $\mu$ is a fluid viscosity, Q is the fluid flow rate through the pump, D is an impeller diameter of the pump, and k is a mean height of roughness in the pump;
a memory in communication with the processor, the memory having a set of instructions, wherein the set of instructions, when executed by the processor, are configured to:
obtain a statistical model representing the well performance;
using the statistical model and the measurements and/or well test data, predict real-time production of the one or more artificial lift wells and generate a measure of confidence;
when the measure of confidence is greater than a pre-determined level, obtain additional measurements and/or test data from the one or more artificial lift wells representing the well performance at an additional time period;
when the measure of confidence is less than the pre-determined level, identify potential optimization opportunities for the well performance based on the predicted real-time production of the one or more artificial lift wells; and
output the potential optimization opportunities so that hydrocarbon production activities may be modified using the potential optimization opportunities.

11. The apparatus of claim 10, wherein the measurements and/or well test data include one or more of the pump head, the pump speed, the electrical and/or mechanical power of the pump, the fluid density, the fluid viscosity, the impeller diameter of the pump, and the mean height of roughness in the pump.

12. The apparatus of claim 11, wherein the pump is an electric submersible pump or a progressing cavity pump.

13. A method of producing hydrocarbons from one or more artificial lift wells, comprising:
obtaining measurements and/or well test data from the one or more artificial lift wells representing well performance at more than one time period, the measurements and/or well test data representing a fluid flow rate through a pump associated with the one or more artificial lift wells, wherein the fluid flow rate through the pump is determined using formula:

$$G(gH,N,P,\rho,\mu,Q,D,k)=0 \qquad \text{(Eq. 1),}$$

where H denotes a pump head, N is a pump speed ($T^{-1}$), P is an electrical and/or mechanical power of the pump, g is a gravitational force, $\rho$ is a fluid density, $\mu$ is a fluid viscosity, Q is the fluid flow rate through the pump, D is an impeller diameter of the pump, and k is a mean height of roughness in the pump;
obtaining a statistical model of the one or more artificial lift wells, the statistical model representing the well performance of the one or more artificial lift wells;
using the statistical model and the measurements and/or well test data, predicting real-time production of the one or more artificial lift wells and generating a measure of confidence;
when the measure of confidence is greater than a pre-determined level, obtaining additional measurements and/or test data from the one or more artificial lift wells representing the well performance at an additional time period;
when the measure of confidence is less than the pre-determined level, identifying potential optimization opportunities for the well performance based on the predicted real-time production of the one or more artificial lift wells;
outputting the potential optimization opportunities; and
producing hydrocarbons from the one or more artificial lift wells using the potential optimization opportunities.

14. The method of claim 13, wherein producing the hydrocarbons comprises modifying performance of the pump.

15. The method of claim 14, wherein the pump comprises an electric submersible pump or a progressing cavity pump.

16. The method of claim 13, wherein predicting the real-time production comprises a machine learning-based formulation.

17. The method of claim 13, further comprising:
storing the measurements and/or well test data from the more than one time period until the real-time production is predicted.

18. The method of claim 13, wherein the measurements and/or well test data include one or more of the pump head, the pump speed, the electrical and/or mechanical power of the pump, the fluid density, the fluid viscosity, the impeller diameter of the pump, and the mean height of roughness in the pump associated with the one or more artificial lift wells.

* * * * *